(12) United States Patent
Cheong et al.

(10) Patent No.: US 10,050,170 B2
(45) Date of Patent: Aug. 14, 2018

(54) METHOD OF MANUFACTURING SOLAR CELL

(71) Applicant: LG ELECTRONICS INC., Seoul (KR)

(72) Inventors: Juhwa Cheong, Seoul (KR); Junyong Ahn, Seoul (KR); Wonjae Chang, Seoul (KR); Jaesung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/418,336

(22) Filed: Jan. 27, 2017

(65) Prior Publication Data

US 2017/0222085 A1    Aug. 3, 2017

(30) Foreign Application Priority Data

Jan. 29, 2016  (KR) .......................... 10-2016-0011825
Nov. 14, 2016  (KR) .......................... 10-2016-0151337

(51) Int. Cl.
| | | |
|---|---|---|
| *H01L 31/18* | (2006.01) | |
| *H01L 31/20* | (2006.01) | |
| *H01L 31/0236* | (2006.01) | |
| *H01L 31/0216* | (2014.01) | |
| *H01L 31/0745* | (2012.01) | |
| *H01L 31/105* | (2006.01) | |
| *H01L 31/024* | (2014.01) | |

(Continued)

(52) U.S. Cl.
CPC ........ *H01L 31/1864* (2013.01); *H01L 31/024* (2013.01); *H01L 31/0216* (2013.01); *H01L 31/0236* (2013.01); *H01L 31/02167* (2013.01); *H01L 31/02168* (2013.01); *H01L 31/068* (2013.01); *H01L 31/0745* (2013.01); *H01L 31/105* (2013.01); *H01L 31/182* (2013.01); *H01L 31/186* (2013.01); *H01L 31/202* (2013.01); *H01L 31/208* (2013.01); *H01L 31/022441* (2013.01); *Y02E 10/546* (2013.01); *Y02E 10/547* (2013.01)

(58) Field of Classification Search
CPC ............. H01L 31/0745; H01L 31/1864; H01L 31/0216; H01L 31/02168; H01L 31/0236; H01L 31/068; H01L 31/02167; H01L 31/022441; H01L 31/024; H01L 31/105; H01L 31/186; Y02E 10/547; Y02E 10/546
See application file for complete search history.

(56) References Cited

U.S. PATENT DOCUMENTS 5,057,439 A * 10/1991 Swanson ......... H01L 31/022425
136/256
5,907,766 A    5/1999 Swanson et al.
(Continued)

FOREIGN PATENT DOCUMENTS

| CN | 102983214 B | 5/2015 |
|---|---|---|
| JP | 8-254392 A | 10/1996 |

(Continued)

*Primary Examiner* — Bac Au
(74) *Attorney, Agent, or Firm* — Birch, Stewart, Kolasch & Birch, LLP

(57) ABSTRACT

A method of manufacturing a solar cell can include forming a silicon oxide film on a semiconductor substrate and successively exposing the silicon oxide film to a temperature in a range of 570° C. to 700° C. to anneal the silicon oxide film.

18 Claims, 8 Drawing Sheets

(51) Int. Cl.
*H01L 31/068* (2012.01)
*H01L 31/0224* (2006.01)

(56) References Cited

U.S. PATENT DOCUMENTS

| | | | |
|---|---|---|---|
| 8,658,458 B2* | 2/2014 | Graff | H01L 31/0682 |
| | | | 438/97 |
| 2007/0151599 A1 | 7/2007 | Cousins | |
| 2012/0000528 A1 | 1/2012 | Dennis et al. | |
| 2012/0073650 A1* | 3/2012 | Smith | H01L 31/062 |
| | | | 136/258 |
| 2013/0048070 A1 | 2/2013 | Hazeghi et al. | |
| 2013/0089942 A1 | 4/2013 | Boescke | |
| 2015/0050771 A1 | 2/2015 | Sharma et al. | |
| 2015/0357507 A1 | 12/2015 | Yang et al. | |
| 2016/0126400 A1* | 5/2016 | Ji | H01L 31/02167 |
| | | | 136/255 |

FOREIGN PATENT DOCUMENTS

| | | |
|---|---|---|
| JP | 2009-503845 A | 1/2009 |
| KR | 10-2013-0050301 A | 5/2013 |
| KR | 10-2014-0114537 A | 9/2014 |
| KR | 10-2015-0141806 A | 12/2015 |
| WO | 2012-531048 A | 12/2012 |

\* cited by examiner

[FIG 1]
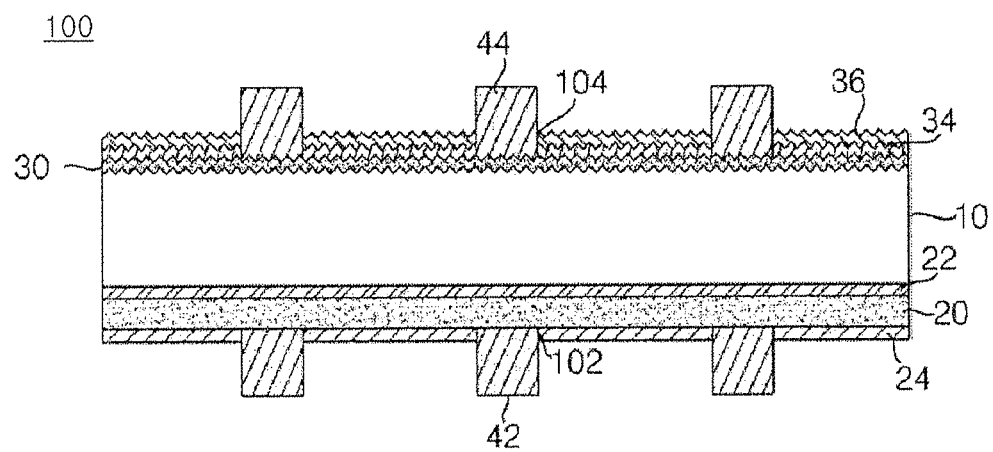

[FIG 2]
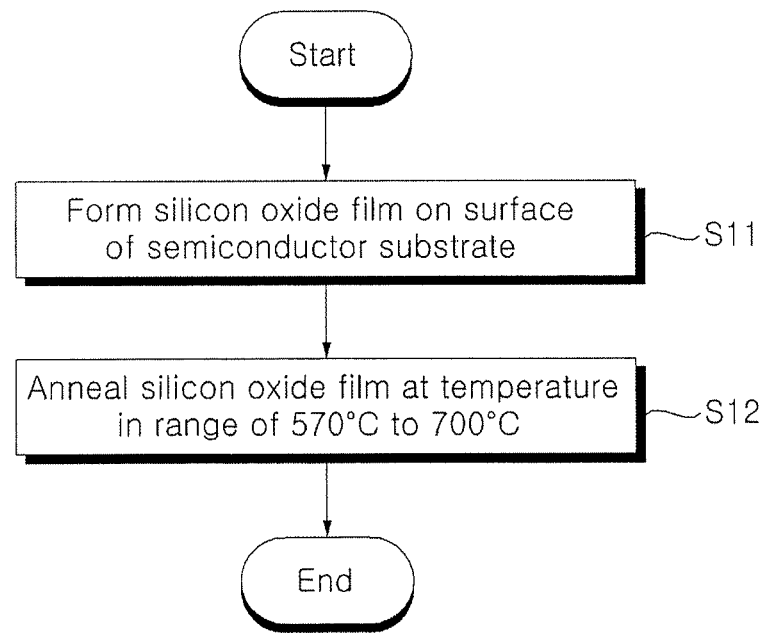

[FIG 3]
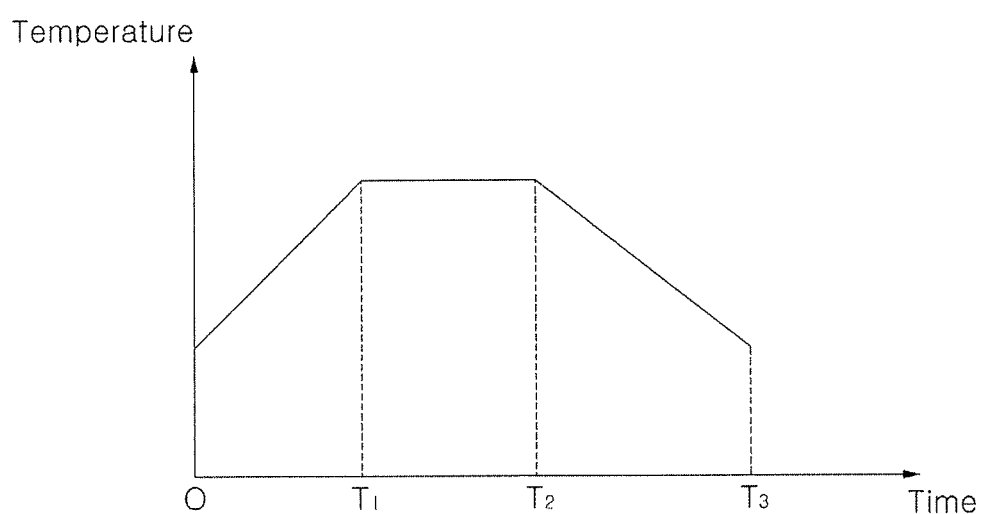

[FIG 4]
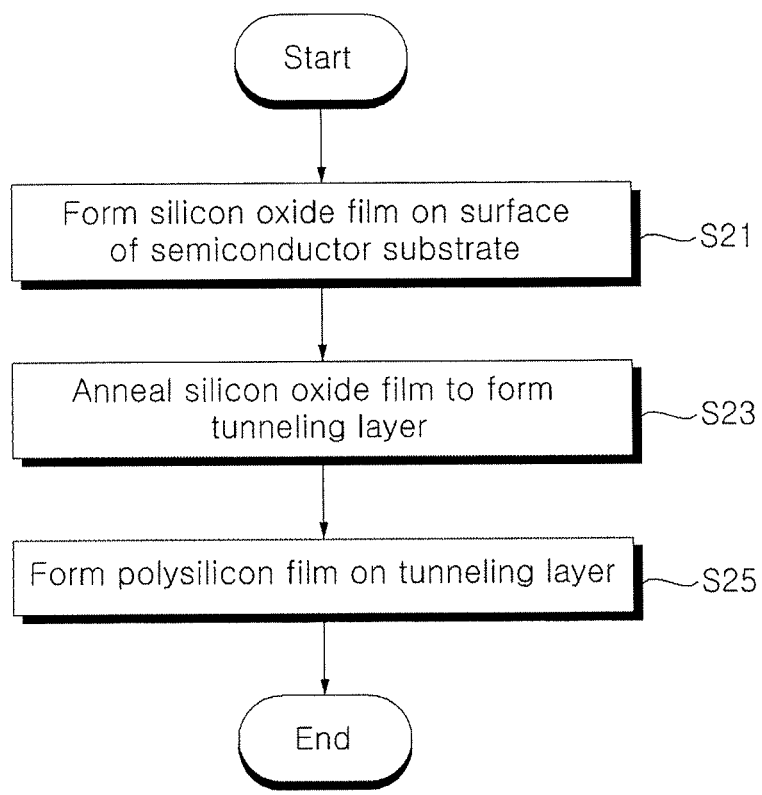

【 FIG 5A 】
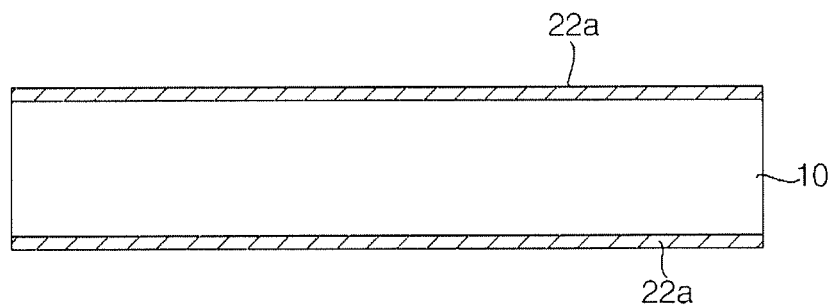
【 FIG 5B 】
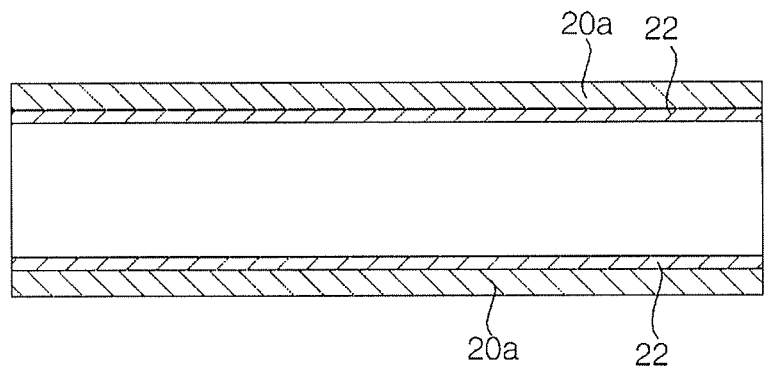

[ FIG 5C ]
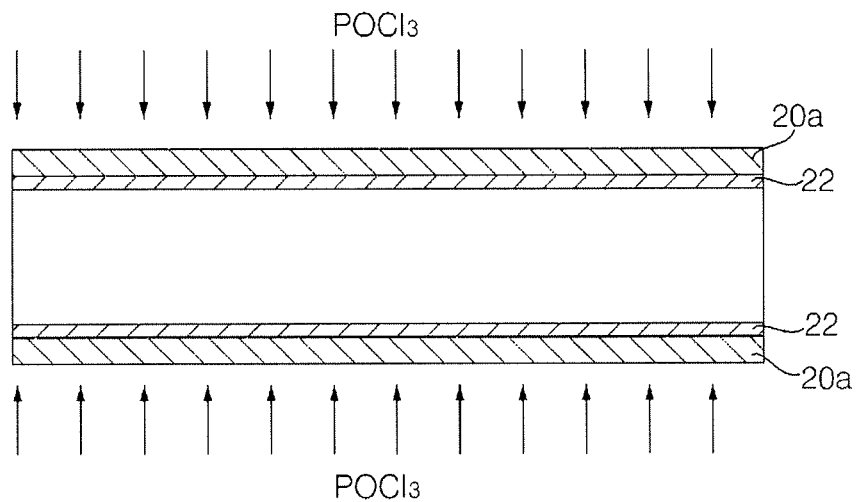
[ FIG 5D ]
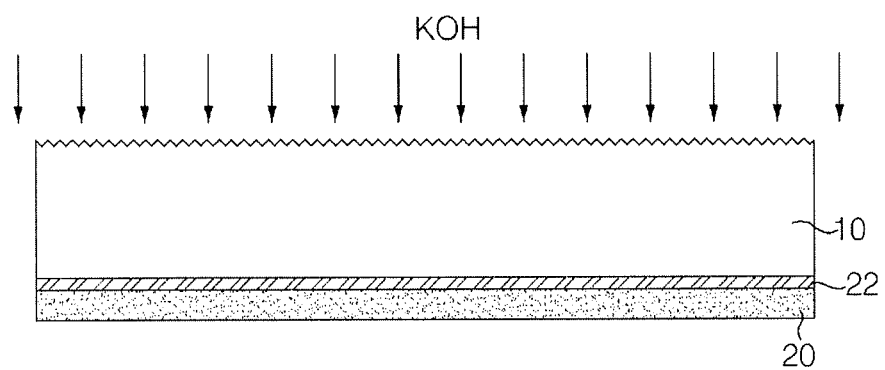

[ FIG 5E ]
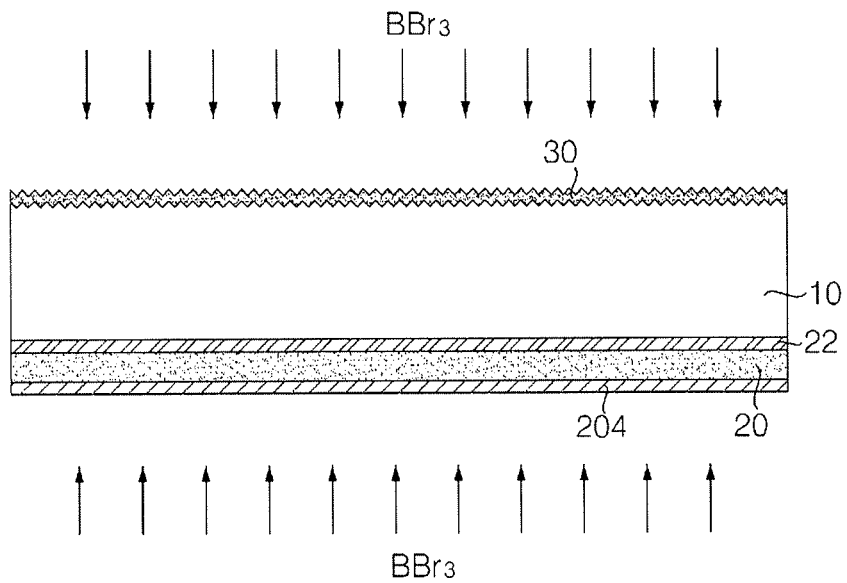
[ FIG 5F ]
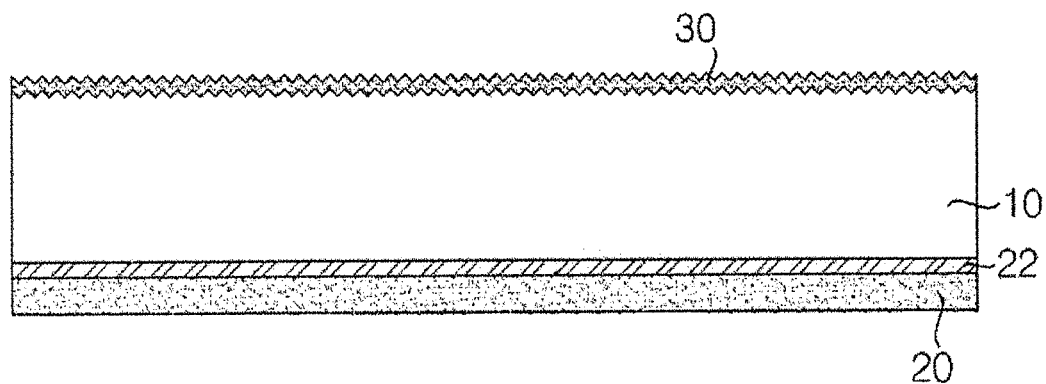

【 FIG 5G 】
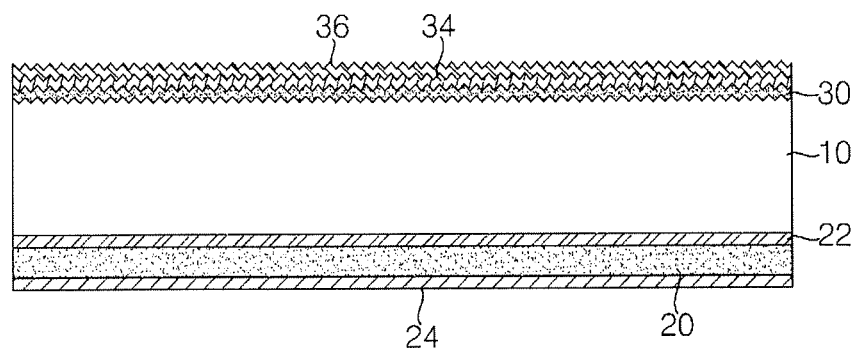
【 FIG 5H 】
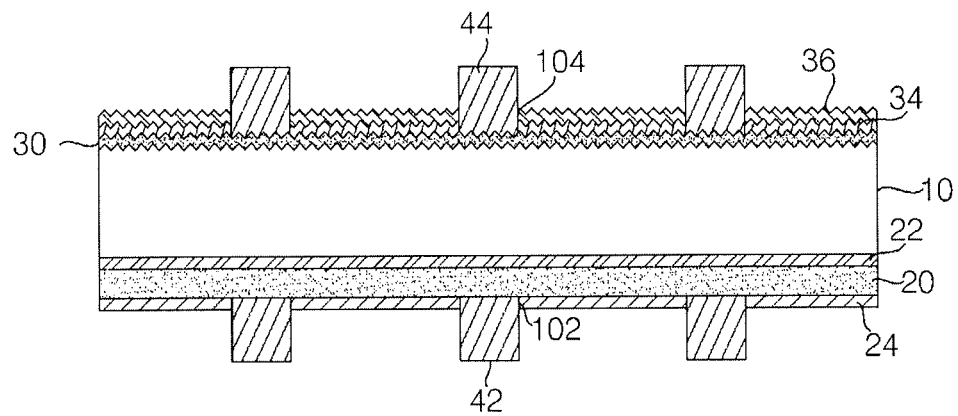

METHOD OF MANUFACTURING SOLAR CELL

CROSS-REFERENCE TO RELATED APPLICATION

This application claims priority to Korean Patent Application No. 10-2016-0011825, filed on Jan. 29, 2016 and Korean Patent Application No. 10-2016-0151337, filed on Nov. 14, 2016 in the Korean Intellectual Property Office, the disclosures of all of these applications are incorporated herein by reference.

BACKGROUND OF THE INVENTION

1. Field of the Invention

An embodiment of the present invention relates to a new method of manufacturing a solar cell having a tunneling layer.

2. Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

Recently developed solar cells have a tunneling layer arranged between a substrate and a semiconductor layer doped with a dopant to improve cell efficiency. The tunneling layer is formed of a silicon oxide and an annealing process is required to obtain the tunneling effect.

Meanwhile, efficiency is an important factor for evaluating the performance of a solar cell and is directly connected to the generation performance of the solar cell.

SUMMARY OF THE INVENTION

Therefore, the present invention has been made in view of the above problems, and it is an object of the present invention to provide a method of manufacturing a solar cell, including: forming a silicon oxide film on a semiconductor substrate; and successively exposing the silicon oxide film to a temperature in the range of 570° C. to 700° C. to anneal the silicon oxide film.

Another object of the present invention is to provide a method of manufacturing a solar cell, including: forming a silicon oxide film on a semiconductor substrate at a first temperature; annealing the silicon oxide film at a second temperature to form a tunneling layer; and forming a polysilicon film on the tunneling layer.

BRIEF DESCRIPTION OF THE DRAWINGS

FIG. 1 is a cross-sectional view of a solar cell manufactured using a manufacturing method according to an embodiment of the present invention.

FIG. 2 is a flowchart illustrating a method of manufacturing a solar cell according to an embodiment of the present invention.

FIG. 3 is a graph showing temperature variation during annealing of a silicon oxide layer according to an embodiment of the present invention.

FIG. 4 is a flowchart illustrating a method of manufacturing a solar cell according to another embodiment of the present invention.

FIGS. 5A to 5H schematically illustrate a procedure of manufacturing the solar cell shown in FIG. 1 using the manufacturing method according to an embodiment of the present invention.

DETAILED DESCRIPTION OF THE PREFERRED EMBODIMENTS

Reference will now be made in detail to the preferred embodiments of the present invention, examples of which are illustrated in the accompanying drawings. However, it will be understood that the present invention should not be limited to the embodiments and can be modified in various ways. In the drawings, to clearly and briefly explain the present invention, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the present invention are not limited to the illustration of the drawings. Further, detailed description of well-known semiconductor manufacturing methods such as deposition and sputtering is omitted so as not to obscure the concept of the present invention.

FIG. 1 illustrates the cross section of a solar cell manufactured using a manufacturing method according to an embodiment of the present invention described below.

Referring to FIG. 1, a solar cell 100 includes a semiconductor substrate 10, an n+ region 20 arranged on the rear surface of the semiconductor substrate 10, and a p+ region 30 arranged on the front surface of the semiconductor substrate 10. Electrodes 42 and 44 include a first electrode 42 connected to the n+ region 20 and a second electrode 44 connected to the p+ region 30. The solar cell 100 can further include insulating layers such as a first passivation film 24, a second passivation film 34 and an antireflection film 36. These components will be described in detail.

The semiconductor substrate 10 is made of monocrystalline silicon. When the semiconductor substrate 10 is formed of monocrystalline semiconductor, the solar cell 100 is based on the semiconductor substrate 10 made of monocrystalline semiconductor having high crystallinity and thus few defects. Accordingly, the solar cell 100 can have excellent electrical properties.

The front surface of the semiconductor substrate 10 can be subjected to texturing, and thus can have protrusions. The protrusions are formed on the (111) plane of the semiconductor substrate 10 and can have pyramidal shapes having irregular sizes. When surface roughness is increased by forming the protrusions on the front surface of the semiconductor substrate 10 through texturing, it is possible to reduce the reflectance of light introduced through the front surface of the semiconductor substrate 10. Accordingly, the quantity of light that reaches a pn junction in the semiconductor substrate 10 can be increased, which can minimize loss of light.

The semiconductor substrate 10 is doped with an n-type or p-type dopant at a low concentration. Desirably, the semiconductor substrate 10 is doped with an n-type dopant.

The n+ region 20 is formed on the overall rear surface of the semiconductor substrate 10. For example, a tunneling layer 22 can be formed on the semiconductor substrate 10 and the n+ region 20 can be formed on the tunneling layer 22.

The tunneling layer 22 can be formed in contact with the rear surface of the semiconductor substrate 10 to simplify the structure and improve the tunneling effect. The tunneling layer 22 acts as a kind of a barrier against electrons and holes such that minority carriers do not pass therethrough and only majority carriers accumulated in proximity to the tunneling layer 22 and thus having energy higher than a specific level can pass therethrough. Further, the tunneling layer 22 can serve as a diffusion barrier for preventing the dopant of the n+ region 20 from diffusing into the semiconductor substrate 10. The tunneling layer 22 can include various materials allowing tunneling of majority carriers, for example, oxide, nitride, semiconductors, conductive polymers and the like. Particularly, the tunneling layer 22 can be formed from a silicon oxide layer containing silicon oxide because the silicon oxide layer has excellent passivation properties and achieves easy carrier tunneling.

To obtain sufficient tunneling effect, the tunneling layer 22 can be thinner than the first and second passivation films 24 and 34 and the first or second conductive regions 20 and 30. For example, the tunneling layer 22 can be equal to or thinner than 2 nm, for example, in a range of 1 nm to 1.5 nm.

Smooth tunneling may not occur when the thickness of the tunneling layer 22 exceeds 2 nm, deteriorating the efficiency of the solar cell 100, whereas it may be difficult to form the tunneling layer 22 having desired quality if the tunneling layer 22 is thinner than 1 nm.

The n+ region 20 is formed as a semiconductor layer including the same semiconductor material (more specifically, a single semiconductor material, e.g., silicon) as the semiconductor substrate 10. This can minimize a property difference that may be generated when the n+ region 20 includes a different semiconductor material having properties similar to the semiconductor substrate 10. However, the n+ region 20 can have a crystalline structure different from the semiconductor substrate 10 to be easily formed on the semiconductor substrate 10 because the n+ region 20 is formed on the semiconductor substrate 10 separately therefrom.

For example, the n+ region 20 can be formed by doping a polysilicon semiconductor layer with an n-type dopant to facilitate carrier movement according to excellent electrical conductivity thereof and induce smooth carrier tunneling to occur in the tunneling layer 22 formed of, for example, oxide.

In the present embodiment, it is possible to solve problems with respect to defects or an open-circuit voltage decrease that can be generated when a doped region is formed in the semiconductor substrate 10 by forming the n+ region 20 separately from the semiconductor substrate 10. Accordingly, the open-circuit voltage of the solar cell 10 can be improved.

The p+ region 30 is formed on the front surface of the semiconductor substrate 10. For example, the p+ region 30 is a doped region formed by doping a p-type dopant into a portion of the semiconductor substrate 10 and forms a pn junction with the semiconductor substrate 10 in the present embodiment.

Here, group III elements such as boron (B), aluminum (Al), gallium (Ga), and indium (In) can be considered as a p-type dopant and group V elements such as phosphorous (P), arsenic (As), bismuth (Bi), and antimony (Sb) can be considered as an n-type dopant.

In the solar cell illustrated in FIG. 1, the n+ region 20 formed separately from the semiconductor substrate 10 is arranged on the rear surface of the semiconductor substrate 10 and the p+ region 30 forming a portion of the semiconductor substrate 10 is arranged on the front surface of the semiconductor substrate 10. If the n+ region 20 having a crystalline structure different from the semiconductor substrate 10 were disposed on the front surface of the semiconductor substrate 10, absorption of light in the n+ region 20 would increase and thus the quantity of light reaching the pn junction would decrease. Accordingly, the n+ region 20 is arranged on the rear surface of the semiconductor substrate 10.

Layers made of insulating materials can be formed on the first and second conductive regions 20 and 30 except openings 102 and 104 corresponding to the first and second electrodes 42 and 44. Such insulating layers are undoped insulating layers including no dopant.

For example, a first insulating layer is formed on the n+ region 20 excluding the opening 102 and a second insulating layer is formed on the p+ region 30 excluding the opening 104. Such insulating layers are passivation films which passivate defects existing on the surface or in the bulk of the doped regions 20 and 30.

In addition, an antireflection film 36 for reducing reflectance of light is formed on the front surface of the semiconductor substrate 10 as another insulating layer.

The aforementioned insulating layers have a single-layer structure including one selected from a group consisting of a silicon nitride film, a silicon nitride film including hydrogen, a silicon oxide film, a silicon oxynitride film, an aluminum oxide film, MgF2, ZnS, TiO2 and CeO2 or a multilayer structure having a combination of at least two thereof.

The first electrode 42 is electrically connected to the n+ region 20 in contact therewith and the second electrode 44 is electrically connected to the p+ region 30. The first and second electrodes 42 and 44 are connected to the n+ region 20 and the p+ region 30 through the openings 102 and 104 formed in the insulating layers, respectively.

FIG. 2 is a flowchart illustrating a method of manufacturing a solar cell according to an embodiment of the present invention.

The method of manufacturing a solar cell according to an embodiment of the present invention includes a step S11 of forming a silicon oxide film on a semiconductor substrate.

The silicon oxide film is formed of a material having a chemical formula of SiOx, desirably, SiO2.

The silicon oxide film can be formed on the semiconductor substrate using wet oxidation, thermal oxidation or chemical oxidation. Chemical oxidation is a method through which the surface of a semiconductor substrate is exposed to a chemical solution made of a liquid oxidizing agent to form a silicon oxide film and can be performed at a temperature in the range of about 60° C. to 90° C. AS an oxidizing agent, ozone (O3), hydrogen peroxide (H2O2) or the like are used.

Wet oxidation is a method of rinsing a semiconductor substrate with DI water, for example, to form a thin oxide film on the surface thereof. Specifically, the semiconductor substrate is exposed to DI water at a temperature in the range of about 80° C. to 90° C. to form a silicon oxide film on the semiconductor substrate.

An oxide film can be formed to an appropriate thickness within a short time by maintaining the temperature of DI water in the aforementioned range. When the temperature of DI water exceeds 90° C., the temperature is close to the boiling point of DI water and thus it may be difficult to perform a stabilized process. When the temperature of DI water is lower than 80° C., it may be difficult to form an oxide film to a sufficient thickness.

Furthermore, when the semiconductor substrate is exposed to DI water for less than 10 minutes, it may be difficult to form an oxide film having a sufficient thickness. When the semiconductor substrate is exposed to DI water for longer than 20 minutes, processing efficiency may decrease due to a long processing time and the tunneling effect may not be obtained due to a thick oxide film.

That is, an oxide film can be effectively formed through wet oxidation by simultaneously controlling time and temperature at which the semiconductor substrate is exposed to DI water.

Wet oxidation can be discriminated from chemical oxidation in that DI water that does not contain an oxidizing agent and the like is used.

When a silicon oxide film is formed on a semiconductor substrate using DI water, processing can be simplified to improve productivity because manufacturing cost is low and an additional rinsing processing is not needed differently from chemical oxidation.

Furthermore, when a silicon oxide film is formed on a semiconductor substrate using DI water, manufacturing cost is low and fewer defect sites are formed than in chemical oxidation and thus a silicon oxide film having enhanced quality can be obtained. Thermal oxidation is performed in such a manner that a semiconductor substrate is loaded into a chamber at a temperature in the range of 550° C. to 700° C. and reactive gases are injected thereto to cause chemical reaction to occur on the surface of the semiconductor substrate for 1 minute to 2 minutes. Nitrogen (N2) and oxygen (O2) can be used as reactive gases and liquid bubbles of water or hydrochloric acid can be added.

The thickness of the silicon oxide film falls in the range of 1 to 1.5 nm, and it is difficult to achieve the tunneling effect at thicknesses of 1.5 nm or more.

Moreover, it is possible to easily control the thickness of the silicon oxide film by forming the silicon oxide film at a low temperature, as described above, in the present embodiment. When the silicon oxide film is formed through thermal oxidation, an annealing process S12 following oxidation can be performed in the same chamber in situ and thus manufacturing time can be reduced.

The annealing process S12 can make the silicon oxide film denser to improve the passivation function thereof. Specifically, the manufacturing method according to an embodiment of the present invention can include the step S12 of annealing the silicon oxide film in a chamber at a temperature in the range of 570° C. to 700° C. to convert the silicon oxide film into a tunneling layer. The annealing process can be performed in a nitrogen (N2) atmosphere. Here, ambient gas during annealing can cover a range that can be easily employed by those skilled in the art.

The silicon oxide film can be exposed and annealed in the chamber at a temperature in the range of about 570° C. to 750° C., specifically, about 570° C. to 700° C., and more specifically, about 600° C. to 700° C. Desirably, the silicon oxide film starts to be slowly heated from about 570° C. to about 700° C. and then the temperature slowly decreases to minimize thermal stress.

FIG. 3 shows temperature variation during annealing.

As shown in FIG. 3, the semiconductor substrate is slowly heated from a start temperature to a maximum temperature for a period from 0 to t1, held at the maximum temperature for a period from t1 to t2, and the temperature slowly decreases from the maximum temperature to the start temperature for a period from t2 to t3. The period from 0 to t1 can be defined as a first period, the period from t1 to t2 can be defined as a second period and the period from t2 to t3 can be defined as a third period.

In the first period, the start temperature is a temperature at which the semiconductor substrate starts to be heated in the chamber and is equal or higher than about 600° C., and the maximum temperature is about 700° C. While the word "about" is used in description of numerical values throughout the specification, the word is used because numerical values can vary according to numerical value measurement positions, time, methods and the like and is not intended to make the description unclear.

The start temperature is set to a temperature equal to or higher than about 600° C. in order to reduce a difference between the start temperature and the maximum temperature. As the difference between the start temperature and the maximum temperature decreases, less stress with respect to thermal deformation is applied to the semiconductor substrate. Desirably, the difference between the start temperature and the maximum temperature is less than 100° C.

If the temperature difference exceeds 100° C., the semiconductor substrate may be damaged during annealing due to stress with respect to thermal deformation caused by a large temperature difference, and process running time lengthens, increasing manufacturing costs.

It is desirable that a temperature increase per minute is about 10° C. and increase time is 8 to 12 minutes from the start temperature to the maximum temperature (e.g., 0 to t1) in consideration of thermal stress applied to processing equipment or the semiconductor substrate.

When the increase time is less than 8 minutes, thermal stress applied to the semiconductor substrate increases due to excessively high temperature increase per minute. When the increase time exceeds 12 minutes, running time increases and a temperature difference between the maximum temperature and the start temperature excessively increases.

In the second period, the semiconductor substrate is heated to the maximum temperature from t1 to t2. Desirably, the maximum temperature is about 700° C. and heating time is 12 to 18 minutes.

The maximum temperature is about 700° C. in consideration of the temperature difference between the start temperature and the maximum temperature. The heating time is controlled depending on the maximum temperature. Most stabilized annealing is achieved when heating is performed for 12 to 18 minutes at the maximum temperature of 700° C. If the maximum temperature decreases below 700° C., the heating time (t1 to t2) relatively increases. This is not desirable for industrial applicability because running time lengthens, increasing manufacturing costs. When the maximum temperature exceeds 700° C., properties of the oxide film may be deteriorated.

In the third period, the semiconductor substrate is slowly heated while the maximum temperature decreases to the start temperature from t2 to t3.

In the third period, temperature slowly decreases to stabilize the film quality. A temperature decrease per minute in the third period is about 5° C. and it is desirable that the temperature decrease per minute be smaller than the temperature increase per minute in the first period to achieve successful annealing (e.g., the temperature decrease rate in the third period is slower than the temperature increase rate in the first period).

As such, stabilization time of the third period is longer than the first period, more desirably, about twice as long as the first period, 16 to 24 minutes, in a preferred embodiment of the present invention.

Further, it is desirable that the total sum of the first, second and third periods not exceed 1 hour. When the total sum of the first, second and third periods exceeds 1 hour, the semiconductor substrate is exposed to a high temperature for an excessively long time, aggravating thermal stress and the running time lengths, increasing manufacturing costs.

Meanwhile, in step S12, annealing is performed with the silicon oxide film exposed, and thus the silicon oxide film can be converted into the tunneling layer through annealing at a low temperature in the range of 570° C. to 700° C.

When a silicon oxide film 22a is heated at a temperature lower than 570° C., the silicon oxide film 22a is not converted into the tunneling layer 22 and, even if the silicon oxide film 22a is converted into the tunneling layer 22, little tunneling effect is obtained. Such a result can be confirmed through experimental results described below.

According to an embodiment of the present invention described above, it is possible to reduce stress with respect to thermal deformation applied to the silicon oxide film and decrease processing time owing to small temperature variation. Furthermore, it is possible to anneal the silicon oxide film using the same chamber as that used to form the silicon oxide film and thus an in-situ process can be performed to further decrease processing time.

FIG. 4 is a flowchart illustrating a method of manufacturing a solar cell according to another embodiment of the present invention.

The method of manufacturing a solar cell according to another embodiment of the present invention includes a step S21 of forming a silicon oxide film on a semiconductor substrate at a first temperature. The silicon oxide film is formed of a material having a chemical formula of SiOx, desirably, SiO2.

The silicon oxide film can be formed on the semiconductor substrate using wet oxidation, thermal oxidation or chemical oxidation.

Chemical oxidation is a method through which the surface of a semiconductor substrate is exposed to a liquid oxidizing agent to form a silicon oxide film. As the oxidizing agent, ozone (O3), hydrogen peroxide (H2O2) or the like are used. Such chemical oxidation is performed in such a manner that the surface of the semiconductor substrate is dipped in the oxidizing agent at a temperature in the range of 70° C. to 90° C. for 5 to 15 minutes to oxidize the surface of the semiconductor substrate.

Wet oxidation is a method of rinsing a semiconductor substrate with DI water, for example, to form a thin oxide film on the surface thereof. Specifically, the semiconductor substrate is exposed to DI water at a temperature in the range of about 80° C. to 90° C. to form a silicon oxide film on the semiconductor substrate.

An oxide film can be formed to an appropriate thickness within a short time by maintaining the temperature of DI water in the aforementioned range. When the temperature of DI water exceeds 90 te thickness within a short time by maintaining the temperature of DI water in the aforemen- tioned range.n the semiconductor When the temperature of DI water is lower than 80 ckness within a short time by maintaiide film to a sufficient thickness.

Furthermore, when the semiconductor substrate is exposed to DI water for less than 10 minutes, it may be difficult to form an oxide film having a sufficient thickness. When the semiconductor substrate is exposed to DI water for longer than 20 minutes, processing efficiency may decrease due to a long processing time and the tunneling effect may not be obtained due to a thick oxide film.

That is, an oxide film can be effectively formed through wet oxidation by simultaneously controlling time and temperature at which the semiconductor substrate is exposed to DI water.

Wet oxidation can be discriminated from chemical oxidation in that DI water that does not contain an oxidizing agent and the like is used.

When a silicon oxide film is formed on a semiconductor substrate using DI water, processing can be simplified to improve productivity because manufacturing cost is low and an additional rinsing processing is not needed differently from chemical oxidation.

Furthermore, when a silicon oxide film is formed on a semiconductor substrate using DI water, manufacturing cost is low and fewer defect sites are formed than in chemical oxidation and thus a silicon oxide film having enhanced quality can be obtained. Thermal oxidation is a method of forming a silicon oxide film on a semiconductor substrate. Thermal oxidation is performed in such a manner that the semiconductor substrate is loaded into a chamber at a temperature in the range of 550° C. to 700° C. and reactive gases are injected thereto to cause chemical reaction to occur on the surface of the semiconductor substrate for 1 minute to 2 minutes. Nitrogen (N2) and oxygen (O2) can be used as reactive gases and liquid bubbles of water or hydrochloric acid can be added.

The thickness of the silicon oxide film falls in the range of 1 to 1.5 nm, and it is difficult to achieve the tunneling effect at thicknesses of 1.5 nm or more.

When the silicon oxide film is formed through thermal oxidation, an annealing process S23 following oxidation can be performed in the same chamber in situ and thus manufacturing time can be reduced.

The manufacturing method according to another embodiment of the present invention includes the step S23 of annealing the silicon oxide film in a chamber at a temperature in the range of 570° C. to 700° C. to convert the silicon oxide film into a tunneling layer.

The silicon oxide film is annealed at a temperature in the range of about 570° C. to 750° C. in the chamber. In a preferred embodiment, the silicon oxide film starts to be slowly heated from about 570° C. to about 700° C. and then the temperature slowly decreases to minimize thermal stress. In this manner, annealing is performed as shown in FIG. 3.

Subsequently, the manufacturing method according to another embodiment of the present invention includes a step S25 of forming a polysilicon film on the tunneling layer.

In a preferred embodiment, the polysilicon film is formed to a thickness in the range of 300 to 400 nm through LPCVD (low pressure chemical vapor deposition).

A reactive gas used in this process includes a gas containing Si that forms the polysilicon film, for example, silane gas. The polysilicon film is formed using only a simple gas (e.g., silane gas) containing only Si as a reactive gas because the polysilicon film has a polycrystalline structure. Additionally, nitric oxide (N2O) gas and/or oxygen (O2) gas can be introduced along with the reactive gas to control crystal grain size, crystallinity and the like, achieving satisfactory crystal growth.

When a semiconductor film is formed using LPCVD, amorphous silicon (a-Xi) or polysilicon can be deposited to form the semiconductor film by controlling a reaction temperature. The amorphous silicon is deposited at a reaction temperature lower than about 600° C. and the polysilicon is deposited at a reaction temperature higher than about 600° C.

In a preferred embodiment, the polysilicon film can be directly formed on the tunneling layer at a temperature equal to or higher than about 600° C. for 20 to 35 minutes through LPCVD. More preferably, LPCVD is performed within the temperature range of the annealing process such that there is little temperature difference between the two processes. In this case, thermal stress applied to the semiconductor substrate can be reduced because there is little temperature difference between the two processes. Further, running time can also be decreased because little temperature difference shortens a time required to adjust temperatures between processes to stabilize the processes.

Although it is also possible to deposit amorphous silicon first and then form a polysilicon film from the amorphous silicon through annealing, annealing needs to be performed at a temperature of around 900° C. to convert amorphous silicon into polysilicon. Such high-temperature annealing increases thermal stress applied to the silicon oxide film and causes temperature variation to increase, aggravating thermal stress. Furthermore, when such a high temperature is used, process running time increases, resulting in manufacturing cost increase and efficiency reduction.

In the present embodiment, the polysilicon film is formed on the tunneling layer to skip a process of heat-treating the polysilicon film, and the silicon oxide film is annealed at a low temperature prior to formation of the polysilicon film.

A description will be given of experiment results representing effects of an embodiment of the present invention.

To look into the effects of the present invention, four samples were manufactured and implied Voc was measured through Sun-Voc measurement as follows.

Sample 1

Sample 1 was manufactured in such a manner that a silicon oxide film was formed of SiO2 on a semiconductor substrate to a thickness in the range of 1 to 1.5 nm, slowly heated and then cooled in a temperature range of 570° C. to 700° C. to be annealed, and a polysilicon semiconductor film and a SiNx insulating film were formed on the silicon oxide film.

Sample 2

Sample 2 was manufactured in such a manner that a silicon oxide film was formed on a semiconductor substrate to a thickness in the range of 1 to 1.5 nm and a polysilicon semiconductor film and a SiNx insulating film are formed thereon without annealing.

Sample 3

Sample 3 was manufactured in such a manner that a silicon oxide film was formed of SiO2 on a semiconductor substrate to a thickness in the range of 1 to 1.5 nm and then slowly heated to a temperature in the range of 570° C. to 700° C. to be annealed, a semiconductor film was formed of polysilicon on the silicon oxide film and then an n-type dopant was diffused into the semiconductor film at a temperature in the range of 800° C. to 1000° C. to form an n+ doped region, and then an insulating film was formed of SiNx thereon.

Sample 4

Sample 4 was manufactured in such a manner that a silicon oxide film was formed on a semiconductor substrate to a thickness in the range of 1 to 1.5 nm, a semiconductor film was formed of polysilicon on the silicon oxide film without annealing and then an n-type dopant was diffused into the semiconductor film at a temperature in the range of 750° C. to 900° C. to form an n+ doped region, and then an insulating film was formed of SiNx thereon.

Results of measurement of implied Voc of samples 1 to 4 manufactured as above are shown in the following table 1.

TABLE 1

| | Implied Voc (mV) |
|---|---|
| Sample 1 | 720 to 730 |
| Sample 2 | 680 |
| Sample 3 | 735 |
| Sample 4 | 680 |

It can be confirmed from the above experimental results that implied Voc increases by 40 to 50 in the case in which the silicon oxide film is annealed at a temperature in the range of 570° C. to 700° C. (sample 1), compared to the case in which the silicon oxide film is not annealed (samples 2 and 4).

In addition, sample 4 differs from sample 2 in that the former has the n+ doped region formed in the semiconductor film, and silicon oxide film annealing is omitted in both samples 2 and 4. The experimental results show that samples 2 and 4 have the same value of implied Voc, 680.

Such results demonstrate that the silicon oxide film is converted into a tunneling layer to achieve the tunneling effect only when annealing is performed immediately after formation of the silicon oxide film.

The results can be configured by comparing sample 1 with sample 3. While annealing is performed immediately after the silicon oxide film is formed in both samples 1 and 3, and annealing is additionally performed after formation of the semiconductor film only in sample 3, sample 1 and sample 3 have similar values of implied Voc. This demonstrates that annealing performed immediately after formation of the silicon oxide film is effective and annealing performed after formation of the semiconductor film does not affect cell efficiency improvement.

A procedure of manufacturing the solar cell illustrated in FIG. 1 through the aforementioned manufacturing method according to an embodiment of the present invention will be described with reference to FIGS. 5A to 5H.

FIG. 5A illustrates a process corresponding to S11 and S12 of FIG. 2 and S21 and S23 of FIG. 4. In this process, a silicon oxide film 22a is formed on the front surface and the rear surface of the semiconductor substrate 10.

The semiconductor substrate 10 can be a silicon wafer or a bulk silicon substrate. The silicon oxide film can be formed of a material having a chemical formula of SiOx, preferably, SiO2.

The silicon oxide film 22a is formed to a thickness in the range of 1 to 1.5 nm using wet oxidation, thermal oxidation or chemical oxidation. It is difficult to achieve the tunneling effect at a thickness equal to or greater than 1.5 nm.

When the silicon oxide film is formed using thermal oxidation, the following annealing process can be performed in the same chamber in-situ, reducing manufacturing time.

The present process includes annealing of heating the silicon oxide film 22a to a temperature in the range of 570° C. to 700° C. as described above. Accordingly, the silicon oxide film 22a is converted into a tunneling layer 22. In a preferred embodiment, the silicon oxide film 22a is slowly heated from a temperature of around 600° C. to reach about 700° C. and then the temperature decreases to around 600° C. to minimize thermal stress.

Here, the silicon oxide film 22a can be converted into the tunneling layer at a temperature in the range of 570° C. to 700° C. because annealing is performed while the silicon oxide film 22a is exposed. If annealing is performed after other layers are formed on the silicon oxide film 22a, thermal stress is aggravated because a higher annealing temperature is required and process running time increases due to the high temperature.

In conventional technologies, the silicon oxide film 22a is heated to about 900° C. and thus considerable thermal stress is applied to the silicon oxide film and is further aggravated due to remarkable temperature variation. When a high temperature is used in this manner, process running time lengths, increasing manufacturing costs and decreasing efficiency.

If the silicon oxide film 22a is heated at a temperature lower than 570° C., the silicon oxide film 22a is not converted into the tunneling layer 22 and, even if the silicon oxide film 22a is converted into the tunneling layer 22, little tunneling effect is obtained.

Referring to FIG. 5B, an intrinsic semiconductor film 20a is formed on the tunneling layer 22 formed on the front surface and the rear surface of the semiconductor substrate 10. This process corresponds to step S25 of FIG. 4.

The intrinsic semiconductor film 20a is an undoped pure semiconductor film and is preferably formed of polysilicon.

The intrinsic semiconductor film 20a can be formed using CVD (chemical vapor deposition) and, more specifically, LPCVD (low pressure chemical vapor deposition).

A reactive gas used in this process includes a gas containing Si that forms the intrinsic semiconductor film 20a, for example, silane gas. Since the semiconductor film 20a is formed of intrinsic polysilicon in the present embodiment, only a gas containing Si is used as an ambient gas.

In addition, nitrogen oxide (N2O) gas and/or oxygen (O2) gas can be additionally introduced to control a crystal grain size, crystallinity and the like, achieving satisfactory crystal growth.

In this process, a deposition temperature in the range of 600° C. to 700° C., which falls within the temperature range of 570° C. to 700° C. used for the above annealing process, is used, and thus there is little temperature variation between the two processes. Accordingly, thermal stress applied to the semiconductor substrate can be minimized and a time required to adjust temperatures between the processes to stabilize the processes can be decreased owing to little temperature variation, reducing the running time.

Referring to FIG. 5C, the semiconductor film 20a is doped with a dopant to form a doped n+ region 20.

The semiconductor film 20a can be made into the n+ region 20 using thermal diffusion through which the dopant is diffused into the semiconductor film 20a in a heated diffusion furnace.

FIG. 5C illustrates formation of the n+ region 20 through thermal diffusion. When the semiconductor substrate 10 is n type, thermal diffusion is performed in an ambient gas containing POCl3.

When POCl3 is used as a doping source, POCl3 and O2 introduced into the chamber react with each other at a high temperature to form a P2O5 layer on the surface of the intrinsic semiconductor film 20a, and then phosphorous (P) contained in P2O5 layer is diffused into the intrinsic semiconductor film 20a formed of Si through heat-treatment at a temperature in the range of 750° C. to 900° C. to thereby form the n+ region 20.

Alternatively, the n+ region 20 can be formed using phosphorus silicate glass (PSG).

PSG is deposited using APCVD (Atmospheric Pressure CVD). PSG can be deposited on only one of the semiconductor films 20a formed on the front and rear surfaces of the semiconductor substrate 10 and heated to a temperature in the range of 400° C. to 600° C. such that the semiconductor film 20a is made into the n+ region 20.

Alternatively, the n+ region 20 can be formed in such a manner that a semiconductor film doped with an n-type dopant is formed as the semiconductor film 20a.

Referring to FIG. 5D, the semiconductor film 20a and the tunneling layer 22 formed therebelow, formed on the front surface of the semiconductor substrate 10, are removed.

In this process, the semiconductor film and the tunneling layer are removed from the front surface of the semiconductor substrate 10 and the exposed surface of the semiconductor substrate is textured.

The semiconductor film and the tunneling layer can be removed using any of wet etching and dry etching, preferably, wet etching. Potassium hydroxide (KOH) is used as an etchant and etching can be performed in such a manner that only the front surface of the semiconductor substrate 10 is selectively dipped into a KOH solution.

Referring to FIG. 5E, a p+ region 30 is formed on the front surface of the semiconductor substrate 10. The p+ region 30 is formed in such a manner that the semiconductor substrate 10 is doped with a p-type dopant to make a portion of the semiconductor substrate 10 into a doped region.

The p+ region 30 is formed using various known methods. For example, the p+ region 30 can be formed using thermal diffusion which allows doping minimizing deterioration of properties of the tunneling layer 22. When ion implantation is used, however, the properties of the tunneling layer 22 can be deteriorated due to activation heat-treatment performed at a high temperature after ion implantation.

For example, the p+ region 30 can be formed on the front surface of the semiconductor substrate 10 by forming a passivation film 204 of silicon nitride (SiNx) on the n+ region 20 formed on the rear surface of the semiconductor substrate 10 and performing heat-treatment in an ambient gas containing a p-type dopant.

When the p+ region 30 has a p-type dopant, the p+ region 30 can be heat-treated in an ambient gas containing BBr3. When the p+ region 30 has an n-type dopant, the p+ region 30 can be heat-treated in an ambient gas containing POCl3. Referring to FIG. 5F, the passivation film 204 is removed after formation of the p+ region 30. Various films capable of blocking doping of a second conductivity dopant can be used as the passivation film 204 and removed through elimination methods depending on materials.

In a preferred embodiment, when the p+ region 30 is formed using thermal diffusion, the process is performed at a temperature in the range of 800° C. to 1,000° C. for about 60 minutes.

The reason why the p+ region 30 is formed at a temperature higher than the annealing temperature is to enhance the efficiency of the n+ region 20 by further activating dopants of the n+ region 20 formed in the previous process with thermal energy.

Alternatively, the p+ region 30 can be formed in such a manner that a doped layer including a p-type dopant is selectively formed on the front surface of the semiconductor substrate 10 and the p-type dopant contained in the doped layer is diffused into the semiconductor substrate 10 through heat-treatment. For example, boron silicate glass (BSG) can be used to form the p+ region 30. In this case, BSG can be deposited using LPCVD at a temperature in the range of about 400° C. to 600° C.

Referring to FIG. 5G, a second insulating film 34 and an antireflection film 36 are formed on the p+ region 30 disposed on the front surface of the semiconductor substrate 10.

The second insulating film 34 or the antireflection film 36 can be formed through various methods such as vacuum evaporation, CVD, spin coating, screen printing and spray coating. Here, when the second insulating film 34 or the antireflection film 36 is formed using one-side deposition such as plasma enhanced chemical vapor deposition, the second insulating film 34 or the antireflection film 36 can be easily formed only on the front surface of the semiconductor substrate 10 without using an additional patterning process for the second insulating film 34 or the antireflection film 36.

Referring to FIG. 5G, a first insulating film 24 is formed on the rear surface of the semiconductor substrate 10. The first insulating film is formed on the n+ region 20 disposed on the rear surface of the semiconductor substrate 10.

The first insulating film 24 can be formed using various methods such as vacuum evaporation, CVD, spin coating, screen printing and spray coating.

In the present embodiment, the second insulating film 34 covering the front surface of the semiconductor substrate 10 is formed first and then the first insulating film 24 covering the rear surface of the semiconductor substrate 10 is formed.

Accordingly, it is possible to prevent properties of the n+ region 20 from being deteriorated or damaged during formation of the first insulating film. The properties of the n+ region 20 are very important when the n+ region 20 serves as an emitter region. However, the present invention is not limited thereto and the second insulating film 34 covering the front surface of the semiconductor substrate 10 can be formed after the first insulating film 24 covering the rear surface of the semiconductor substrate 10 is formed.

Referring to FIG. 5H, first and second electrodes 42 and 44 respectively connected to the n+ region 20 and the p+ region 30 are formed.

For example, first and second openings 102 and 104 are formed in the first and second insulating films 24 and 34 through a patterning process and then the first and second electrodes 42 and 44 are formed to fill the first and second openings 102 and 104. Here, the first and second openings 102 and 104 can be formed through various methods such as laser ablation using a laser and a method using an etchant or an etching paste. The first and second electrodes 42 and 44 can be formed using various methods such as plating and deposition.

While an embodiment in which a solar cell having a structure in which electrodes are respectively formed on the front surface and the rear surface of a semiconductor substrate is manufactured using the manufacturing method according to an embodiment of the present invention has been described, the present invention is not limited thereto and can be equally applied to any solar cell structure including a tunneling layer.

For example, in a backside contact solar cell having all electrodes provided on the rear side thereof, the tunneling layer can be formed on the rear surface of the solar cell through the aforementioned method.

In this case, the rear surface of a semiconductor substrate is exposed to thermal oxidation or a chemical solution to form a silicon oxide film to a thickness in the range of 1 to 1.5 nm, and then the silicon oxide film is heated to a temperature in the range of 570° C. to 700° C. and annealed thereat to form a tunneling layer.

The backside contact solar cell includes the semiconductor substrate, the tunneling layer formed on the rear surface of the semiconductor substrate through the aforementioned manufacturing method, a semiconductor film having a p+ region and an n+ region and formed on the tunneling layer, an insulating film formed to cover the semiconductor film, and electrodes respectively coming into contact with the p+ region and the n+ region through contact holes formed in the insulating film.

The above described features, configurations, effects, and the like are included in at least one of the embodiments of the present invention, and should not be limited to only one embodiment. In addition, the features, configurations, effects, and the like as illustrated in each embodiment can be implemented with regard to other embodiments as they are combined with one another or modified by those skilled in the art. Thus, content related to these combinations and modifications should be construed as within the scope and spirit of the invention as disclosed in the accompanying claims.

What is claimed is:

1. A method of manufacturing a solar cell, the method comprising:
    forming a silicon oxide film on a semiconductor substrate; and
    successively exposing the silicon oxide film to a temperature in a range of 570° C. to 700° C. to anneal the silicon oxide film,
    wherein the silicon oxide film is slowly heated from a temperature lower than 700° C. to about 700° C. for a first time period, maintained at the temperature of about 700° C. for a second time period, and then slowly cooled to the lower temperature for a third time period during annealing, and
    wherein a temperature increase per minute for the first time period is about a 10° C. increase per minute.

2. The method according to claim 1, wherein the first time period is 8 to 12 minutes.

3. The method according to claim 1, wherein the lower temperature is equal to or higher than 600° C.

4. The method according to claim 1, wherein the second time period is 12 to 18 minutes.

5. The method according to claim 1, wherein a temperature decrease per minute for the third time period is smaller than a temperature increase per minute for the first time period.

6. The method according to claim 5, wherein the temperature decrease per minute for the third time period is about a 10° C. decrease per minute.

7. The method according to claim 1, wherein the first time period is shorter than the second time period or the third time period.

8. The method according to claim 1, wherein a sum of the first time period, the second time period and the third time period is less than or equal to than 1 hour.

9. The method according to claim 1, wherein the forming of the silicon oxide film and the exposing the silicon oxide film to the temperature in the range of 570° C. to 700° C. are performed through an in-situ process.

10. The method according to claim 1, wherein the silicon oxide film is formed by wet-etching a surface of the semiconductor substrate, exposing the surface of the semiconductor substrate, or using thermal oxidation.

11. The method according to claim 10, wherein the silicon oxide film is $SiO_2$.

12. The method according to claim 11, wherein the silicon oxide is converted into a tunneling layer, and a thickness of the tunneling layer is in a range of 1 to 1.5 nm.

13. A method of manufacturing a solar cell, the method comprising:
   forming a silicon oxide film on a semiconductor substrate at a first temperature;
   annealing the silicon oxide film at a second temperature to form a tunneling layer; and
   forming a polysilicon film on the tunneling layer,
   wherein the silicon oxide film is slowly heated from a temperature lower than 700° C. to about 700° C. for a first time period, maintained at the temperature of about 700° C. for a second time period, and then slowly cooled to the lower temperature for a third time period during annealing, and
   wherein a temperature increase per minute for the first time period is about a 10° C. increase per minute.

14. The method according to claim 13, wherein the silicon oxide film is formed through chemical oxidation in the forming of the silicon oxide film, and
   wherein annealing is performed in a chamber at the second temperature in the forming of the tunneling layer.

15. The method according to claim 13, wherein the silicon oxide film is formed through thermal oxidation in a chamber in the forming of the silicon oxide film, and
   wherein the forming of the tunneling layer is successively performed in the chamber through an in-situ process.

16. The method according to claim 15, wherein the first temperature is the same as the second temperature.

17. The method according to claim 16, wherein the second temperature is in a range of 570° C. to 700° C.

18. The method according to claim 13, wherein the polysilicon film is formed by directly depositing polysilicon on the tunneling layer.

* * * * *